United States Patent [19]

Yamamoto et al.

[11] 3,746,947

[45] July 17, 1973

[54] SEMICONDUCTOR DEVICE

[75] Inventors: Isamu Yamamoto; Mamoru Ueda; Yoshitada Yoneda, all of Itami, Japan

[73] Assignee: Mitsubishi Denki Kabushiki Kaisha, Tokyo, Japan

[22] Filed: Mar. 10, 1970

[21] Appl. No.: 18,224

[30] Foreign Application Priority Data

Mar. 15, 1969 Japan............................44/19726

[52] U.S. Cl........ 317/234 R, 317/234 A, 317/234 G

[51] Int. Cl................................................ H01l 5/00

[58] Field of Search..................................... 317/234

[56] References Cited

UNITED STATES PATENTS

| | | | |
|---|---|---|---|
| 3,551,758 | 12/1970 | Ferree | 317/234 |
| 3,452,254 | 6/1969 | Boyer | 317/234 |
| 3,238,425 | 3/1966 | Geyer | 317/234 |
| 3,499,095 | 3/1970 | Haus | 174/52 |
| 3,518,507 | 6/1970 | Bezouska | 317/234 |
| 3,320,497 | 5/1967 | Neuf | 317/234 |

OTHER PUBLICATIONS

IBM Bulletin, "Semiconductor Housing" Michelitsch Vol. 6, No. 6, November 1963.

*Primary Examiner*—John W. Huckert
*Assistant Examiner*—E. Wojciechowicz
*Attorney*—Robert E. Burns and Emmanuel J. Lobato

[57] ABSTRACT

A flat semiconductor element disposed within a hollow cylindrical insulation has its main opposite faces each in pressure contact with a smaller end face of an electrodes in the form of truncated hollow cone closing each end of the insulation. The electrode is provided at the smaller end with a resilient flange welded to a resilient flange on the adjacent end of the insulation and has many protrusion extend from the recessed larger end portion for cooling purpose. A cover can seal the larger end portion to circulate a coolant around the protrusions.

7 Claims, 6 Drawing Figures

SEMICONDUCTOR DEVICE

BACKGROUND OF THE INVENTION

This invention relates in general to a semiconductor device comprising a hollow cylindrical member of electrically insulating material open at both ends, one electrode block hermetically closing each of the open ends of the hollow cylindrical member to form a sealed space therebetween, and a semiconductor element contacted by and supported between the electrode blocks in the sealed space, and more particularly to improvements in cooling means for such a semiconductor device.

Semiconductor devices of the type as described are already known in the art. Recently, such semiconductor devices have been, in most cases, manufactured such that the semiconductor element is supported under pressure between a pair of the electrode blocks within the sealed space for sliding movement. In order to cool the semiconductor element, a cooling mechanism has been formed by a pair of heat dissipating members abutting under pressure against the external surfaces of the electrode blocks to sandwich the latter therebetween. If desired, a cooling medium such as water, oil, etc. might circulate through the heat dissipating members.

In the semiconductor devices of the type referred to, a thermal contact resistance at the contact surface on which the electrode block is in contact with the heat dissipating member could not decrease below a certain loading limit to the impossibility of improving the effect of heat dissipation because the external surface of the electrode block was only in pressure contact with the heat dissipating member produced separately from the electrode block. It is generally accepted that a pair of metallic members contacting each other with a given contact area has normally a thermal contact resistance on the order of at least 2cm calculated in terms of a copper rod having the same area of cross section. Since for example, a copper rod 40mm in diameter has a resistance to heat conduction of 0.022°C per watt per centimeter, contacting of two copper member with a contact area corresponding to an area of a circle having a diameter of 40 millimeters provides a thermal contact resistance approximating about 0.05°C per watt. From this it will readily be understood that the presence of a contact surface is much detrimental to heat dissipation.

On the other hand, semiconductor elements have recently tended to be caused to withstand higher voltages and increase in capability to handle a power so that a single semiconductor element has been developed having a power loss of a few kilowatts. For example, a semiconductor diode withstanding a voltage of 5,000 volts and having a current capability in the order of 1,000 amperes may give a power loss of 3 kilowatts. This is because the withstanding of high voltages inevitably leads to an increase in thickness of the semiconductor wafer subsequently accompanied by an increase in diameter thereof that still causes the forward voltage drop thereacross to be maintained at a large magnitude. The high voltage drop cooperates with the high current capability to yield a high magnitude of the power loss.

In the semiconductor devices high in power loss as above described, the abovementioned thermal contact resistance on the contact surface of the electrode block and heat dissipating member is particularly an obstacle to obtain an increase in the heat dissipation effect thereof. It is therefore desirable to provide semiconductor devices free from such a contact surface. In this connection it is noted that in semiconductor devices comprising the electrode block bonded to each of the open ends of the hollow cylindrical member of electrically insulating material, the electrode block is normally bonded to the insulating member as by brazing. Therefore if it is desired to omit the contact surface of the electrode and heat dissipating members, it is required to provide a structure not obstructing that bonding operation.

SUMMARY OF THE INVENTION

Accordingly it is an object of the invention to provide a new and improved semiconductor device including no contact surface of an electrode block and heat dissipating member involved and having a structure not obstructing the operation of bonding the electrode block to a hollow cylindrical insulation involved.

The invention accomplishes this object by the provision of a semiconductor device comprising a hollow cylindrical member of electrically insulating material open at both ends, one electrode block hermetically closing each of the open ends of the hollow cylindrical member to form a sealed space therebetween, and a semiconductor element contacted by and supported between the electrode blocks in the sealed space, characterized in that at least one of said electrode blocks is in the form of a truncated cone having one end portion of smaller diameter including an end face contacted by the adjacent one of the main opposite faces of the semiconductor element, and the other end portion of larger diameter greater than the outside diameter of the associated open end of the cylindrical member, the smaller diameter end portion being connected to the larger diameter portion through a conical surface.

The conical electrode block may be preferably provided on the smaller diameter end portion with a flange bonded to a flange rigidly secured to the adjacent open end of the cylindrical member.

The conical electrode block may be advantageously provided at the larger and with a central recess and with a plurality of protrusions extending from the surface of the recess so as to circulate a cooling medium around the protrusions.

BRIEF DESCRIPTION OF THE DRAWINGS

The invention will become more readily apparent from the following detailed description taken in conjunction with the accompanying drawings in which.

DESCRIPTION OF THE PREFERRED EMBODIMENTS

Figure 1:
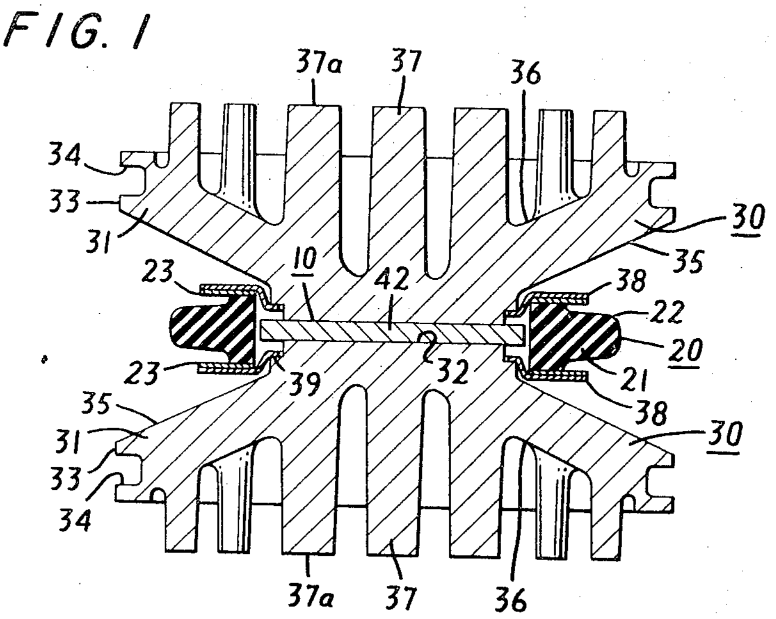
FIG. 1 is a longitudinal sectional view of a semiconductor device constructed in accordance with the principles of the invention.
Figure 2:
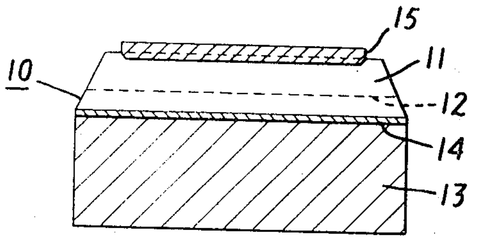
FIG. 2 is a sectional view, of the semiconductor element shown in FIG. 1.

Referring now to FIG. 1 of the drawings there is illustrated a semiconductor device constructed in accordance with the principles of the invention. The arrangement illustrated comprises a semiconductor element generally designated by the reference numeral 10 a hollow cylindrical member of electrically insulating material generally designated by the reference numeral 20 and a pair of electrode blocks generally designated by the reference numeral 30. The semiconductor element 10 may be in the form of a flat semiconductor diode as illustrated in FIG. 2. The diode 10 illustrated comprises a circular wafer 11 of any suitable semiconductive material such as silicon having main opposite faces and a tapered periphery and including a P type layer and an N type layer to form a P-N junction 12 therebetween. Then a support plate 13 of any suitable metallic material such as molybdenum or tungsten is disposed in ohmic contact with the surface of the P type layer of the wafer 11 through a brazing layer 14 made for example of aluminum and a metallic electrode 15 is alloyed on the surface of the N type layer of the wafer 11. The electrode may be preferably formed of gold or antimony. The exposed surface of the silicon wafer 11 has been, of course, subject to the well known surface stabilization treatment to complete the semiconductor element 10.

Figure 3:
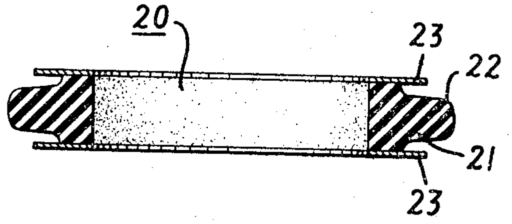
FIG. 3 is a longitudinal sectional view of the hollow cylindrical member of electrically insulating material shown in FIG. 1.

The semiconductor element 10 thus produced is put in place within the hollow cylindrical or insulating member 20 as shown in FIG. 3. As shown, the cylindrical member 20 includes a hollow cylindrical insulation 21 open at both ends, and an annular ridge 22 extending radially and outwardly from the peripheral surface of the insulation. The hollow cylindrical insulation and annular ridge 21 and 22 respectively are formed into a unitary structure of any suitable electrically insulating material such as a ceramic. The cylindrical insulation 21 has brazed on the edges of both open ends a pair of annular flanges 23 having an inside diameter substantially equal to that of the open end and slightly less than the outside diameter of the ridge 22 for the purpose as will be apparent hereinafter.

Figure 4:
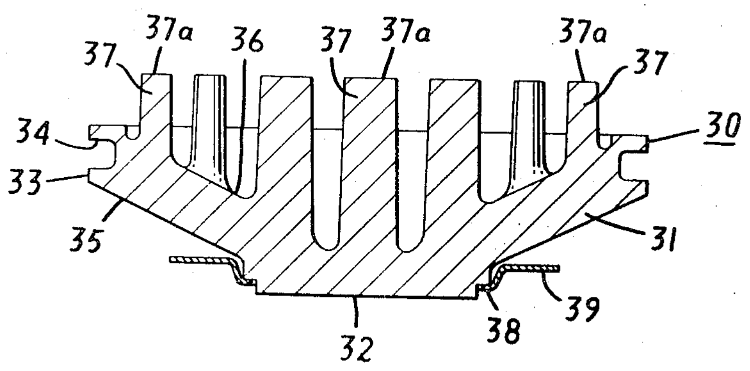
FIG. 4 is a longitudinal sectional view of one of the electrode blocks shown in FIG. 1.
Figure 5:
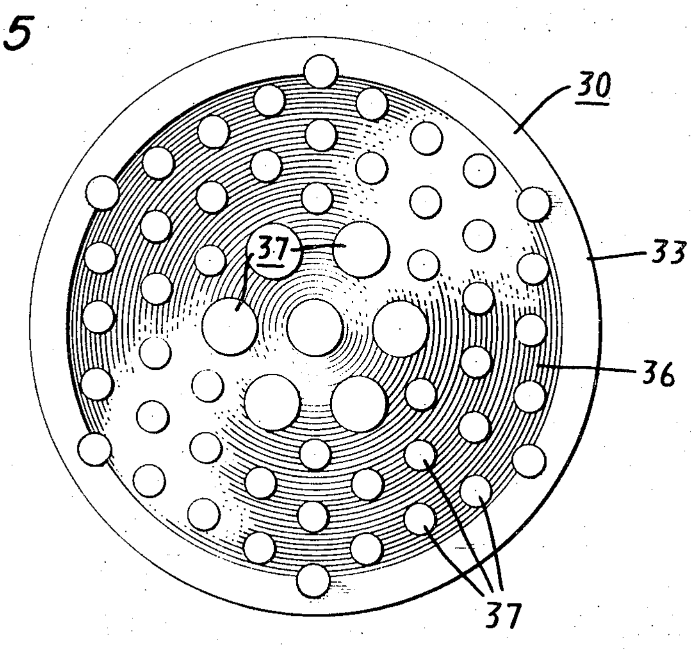
FIG. 5 is a plan view of the electrode block shown in FIGS. 1 and 4.

Disposed on the main opposite faces of the semiconductor element 10 within the hollow cylindrical insulating member 20 are a pair of electrode blocks 30 one of which is shown in FIGS. 4 and 5. Both the electrode blocks 30 are identical in construction to each other and disposed symmetrically with respect to the semiconductor element 10. Therefore only one of the electrode blocks 30 for example, the upper block 30 as viewed in FIG. 1 will now be described in detail with reference to FIGS. 4 and 5.

As shown in FIG. 4, the electrode block 30 includes a metallic electrode element 31 approximating in shape a truncated hollow cone including one end portion of smaller diameter having a circular flat end face 32 and the other end portion 33 of larger diameter formed substantially into a hollow cylinder provided on the outer periphery with an annular recess or groove 34 for the purpose as will be apparent hereinafter. Then the larger end portion 33 is connected to the smaller end portion through a frustoconical surface 35. The electrode element 31 is centrally recessed at the larger end to form therein a hollow defined by a substantially conical surface 36 nearly parallel to the outer surface 35. A plurality of protrusions 37 extend in spaced parallel relationship from the inner cylindrical surface 36 toward the larger end of the electrode element 31 and longitudinally of the "cone" for the purpose as will be apparent later. The protrusions 37 are preferably circular in cross section as shown in FIG. 5 and project somewhat beyond the larger end of the electrode element 31 and have the respective flat end face 37*a* substantially flush with a plane substantially parallel to the larger end face of the electrode element 31 as shown in FIG. 4. As shown in FIG. 5, those protrusion 37 disposed on the central portion of the conical surface 37 are greater in diameter than those disposed on the peripheral edge portion thereof for the purpose as will be apparent hereinafter. The electrode element and protrusions 31 and 37 respectively may be preferably formed into a one-piece unitary structure of any suitable electrically and thermally conductive material, such as copper as by casting.

The electrode element 31 is provided on the outer periphery adjacent the end face 32 with an annular shoulder 38 on which is brazed a bent flange 39 or diaphragm in the form of an annulus. The flange 39 is of any suitable resilient metallic material such as Kovar (trade mark) and less in diameter than the cylindrical end portion 33 of the electrode element 31 and substantially equal in diameter to the annular flange 23 on the cylindrical insulating member 20. The resilient flange 39 is adapted to be welded or otherwise bonded to the flange 23.

The reference numerals designating the components of the upper electrode block 30 have been employed to identify the corresponding components of the lower electrode block 30.

The semiconductor element 10, the cylindrical insulating member 20 and the electrode blocks 30 as above described may be preferably assembled into the semiconductor device of FIG. 1 according to the following steps. First one of the electrode blocks 30, in this case, the lower block as viewed in FIG. 1 is bonded to the lower end of the cylindrical member 20 by having the annular flange 39 abutting against the annular flange 23 and welded to the latter as by argon arc welding. Then the semiconductor element 10 is placed within the hollow cylindrical member 20 on the flat end face 32 of the electrode block 30 with the support plate 13 of the semiconductor element 10 concentrically contacting the end face 32. Thereafter the upper electrode block 30 is bonded to the upper end of the cylindrical member 20 in the same manner as above described to complete the semiconductor device as shown in FIG. 1.

In the resulting device the electrode 15 of the semiconductor element 10 and the flat end face 32 of the upper electrode block 30 have a common contact surface applied with a suitable pressure due to the welding of the flanges 23 and 39 as do the support plate 13 of the semiconductor element 13 and the flat end face 32 of the lower electrode block 30. That pressure results from the resilience of the flange 39. Therefore the semiconductor element 10 is sandwiched under pressure between the upper and lower electrode blocks 30 while it is hermetically enclosed with the hollow cylindrical member 20 closed at both ends by the electrode blocks. In this way the semiconductor element 10 is slidably held within a compartment defined by the cylindrical member and electrode blocks 20 and 30 respectively.

The electrode blocks 30 are in intimate contact with the main opposite faces of the semiconductor element 10 to provide a pair of electrodes for the latter while serving as heat dissipaters for directly cooling the semiconductor element 10. That is, the electrode blocks 30 can be subject for example, to the spontaneous air cooling action resulting from the surrounding air circulating around the protrusions 37 whereby the semiconductor element 10 is more effectively cooled. This eliminates the necessity of providing a separate heat dissipater in pressure contact with the electrode block resulting in any metal-to-metal bonding being not included in a passageway along which heat from the semiconductor element is dissipated. Therefore the efficiency of heat dissipation is much increased.

It is recalled that the electrode blocks 30 each have the frusto-conical surface 35 on that side thereof adapted to be bonded to the cylindrical member 20. This frusto-conical surface 35 is effective for facilitating the operation of bonding the flange 38 to the flange 23 as by welding. Assuming that the electrode block 30 is substantially cylindrical so that the smaller end flares to intersect the extension of the cylindrical portion at the larger end, it is extremely difficult to bond the electrode block 30 to the cylindrical insulation 20. For example, if it is desired to bond both the flanges 23 and 39 to each other by the argon welding process by which electric arc welding is effected in an atmosphere of argon with an arc electrode involved positioned close to the flanges, then the arc electrode is difficult of access to the flanges due to the configuration of the electrode block. On the other hand, the outer periphery in the form of frusto-cone of the electrode block permits the arc electrode to easily approach the flanges 23 and 39 while facilitating the supervision of the particular welding being effected.

With the electrode block 30 formed into a substantially cylindrical shape such as above described, it is to be noted that the peripheral edge portion of the flat end face 32 is remote away from the semiconductor element 10 and therefore does not particularly contribute to heat dissipation. For this reason the outer periphery of the electrode block 30 has been formed of the frusto-conical surface 35 thereby to facilitate the welding operation as above described. Also for the same reason, the central protrusions 37 nearer to the semiconductor element 10 are larger in cross section than the peripheral protrusions.

It is recalled that all the protrusions 37 have the respective free end faces 37*a* lying in a common plane. This measure is advantageous in that the semiconductor device of FIG. 1 can be sandwiched between a pair of pressure plates (not shown). In this event each of the pressure plates abuts against all the end faces 37*a* of the protrusions 37 on one of the electrode block 30 to supply an effective contact force to the associated electrode block.

Figure 6:
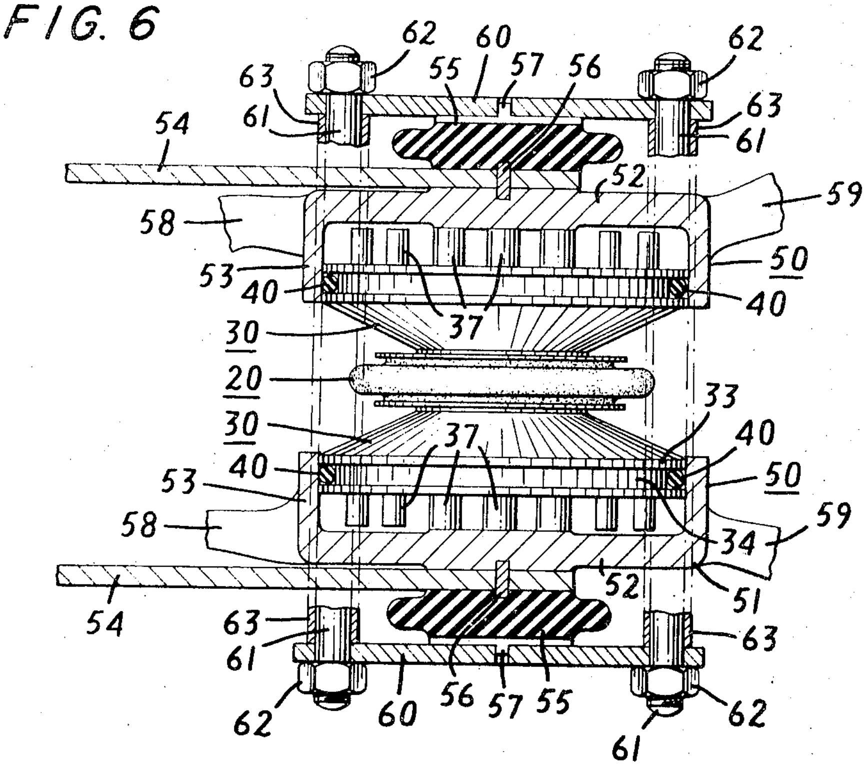
FIG. 6 is an elevational view, partly in longitudinal section of a modification of the invention.

Referring now to FIG. 6 of the drawing, it is seen that the semiconductor device as shown in FIG. 1 has disposed at each end covering means comprising a cover device in order to forcedly cool the electrode blocks 30 with a cooling medium or fluid such as water, oil or gaseous material. Both the cover devices are identical in construction to each other. Therefore only one of the devices, for example, the lower one as viewed in FIG. 6, will now be described in detail and the components of the other or upper device are designated by the same reference numeral denoting the corresponding components of the lower device. The cover device generally designated by the reference numeral 50 consists of a cup-shaped electrically-conductive metallic cover 51 fitted onto the cylindrical end portion 33 of the associated electrode block 30, in this case, the lower electrode block. More specifically, the cover 51 includes a circular bottom portion 51 abutting against and directly contacting most of the protrusions 37 on the electrode block 30 to define an electric current path from the cover 51 through protrusions 37 to the semiconductor element 10 and a cylindrical wall portion 53 standing up on the peripheral edge of the bottom portion 52 and fitted onto the cylindrical end portion 33 of the block 30 with an O-ring 40 disposed in the annular groove 34 on the end portion for sealing purpose. Disposed on the external surface of the bottom portion 52 is an electric terminal plate 54 having a disc-shaped insulation 55 disposed on that surface thereof opposite to the cover 51. Then a positioning pin 56 extends through the terminal plate 54 and has both end portions fitted into the centers of the bottom portion and insulation 52 and 55 by predetermined depths respectively. The insulation 55 is provided on that surface remote from the terminal plate 55 with a central projection 57.

In order to circulate a cooling medium through the sealed interior of the cup-chaped cover 51 to cool the protrusions 37, an entrance and an exit conduit 58 and 59 respectively communicate with the interior of the cover 51.

The components identical to those just described and designated by the same reference numerals are disposed on the upper surface as viewed in FIG. 6 of the semiconductor device 10–20–30. Then the assemblies thus formed are sandwiched between a pair of pressure plates 60 of any suitable resilient metallic material such as iron by having the central projection 57 on each insulation 55 fitted into a central hole disposed on the each plate 60. A plurality of screw-threaded rods 61 extend in spaced relationship through the pressure plates 60 at their positions where they do not contact the upper and lower covers 51 and then fastened to the pressure plates 60 by nuts 62 with one electrically insulating sleeve 63 enclosing each rod 61. Therefore the pressure plates 60 are applied with a fastening force directed toward each other by the cooperation of the bolts 61 and nuts 62 lending to move the same toward each other. As a result the electrode block 30, the cover device 50, the terminal plate 54 and the insulation 55 for each of the upper and lower assemblies are held in place with a suitable fastening force preselected to be of about 1.0 to 1.5 tons.

In the arrangement as shown in FIG. 6, the cooling medium is introduced into the interiors of the cover device 50 through the entrance conduits 58 to flow around the protrusions 37 efficiently cool the semiconductor element 10.

The invention has several advantages: For example, the bonding flange on the electrode block can be hermetically welded to the hollow cylindrical insulation enclosing the semiconductor element in a simple and efficient manner, while increasing the effect of heat dissipation. Thus it is very effective for increasing the capability of semiconductor devices. In addition, the protrusions on the electric block can be forcedly cooled to further increase the effect of heat dissipation.

While the invention has been illustrated and described in conjunction with a few preferred embodiments thereof, it is to be understood that various changes and modification may be made without departing from the spirit and scope of the invention. For example instead of flat semiconductor diodes the invention is equally applicable to other flat semiconductor elements such as power transistors and thyristors.

What we claim is:

1. A semiconductor device comprising: a hollow cylindrical member composed of electrically insulating material open at both ends; a pair of electrode blocks disposed to hermetically close both open ends of said hollow cylindrical member to define a sealed space therebetween interiorly of said cylindrical member; and a semiconductor element having a pair of opposite main faces and disposed in said sealed space supported by said electrode blocks therebetween; wherein at least one of said electrode blocks comprises a one-piece unitary structure having the configuration of a truncated cone having a smaller diameter portion and a larger diameter portion, said smaller diameter portion extending into the associated open end portion of said hollow cylindrical member and having its end surface in contact with the adjacent one of said main faces of said semiconductor element and wherein said smaller diameter portion is provided on a peripheral surface portion thereof with a flange welded to a flange disposed on the adjacent open end of said hollow cylindrical member, and wherein said larger diameter portion has an outside diameter greater than that of the open end of said hollow cylindrical member and ispositiioned outside of said cylindrical member and wherein said larger diameter portion is provided at the free end thereof with means therein defining a recess and a plurality of protrusions extending outwardly from the surface of said recess defining with the remainder of said one electrode block a one-piece unitary structure free of metallic interfaces therebetween, and wherein said smaller and larger diameter portions are interconnected by a frusto-conical surface disposed therebetween; and electrically conductive covering means covering said plurality of protrusions and directly contacting at least some of said protrusions to define an electric current path from said covering means through the protrusions to said semiconductor element and wherein said covering means cooperates with said larger diameter portion to define a sealed space containing wherein said plurality of protrusions, and means defining inlet and outlet openings in said covering means for effecting circulation of a cooling medium through said sealed space and around said protrusions during use of the semiconductor device.

2. A semiconductor device comprising: a hollow cylindrical member composed of electrically insulating material and having a pair of open ends; a semiconductor element disposed interiorly of said hollow cylindrical member; a pair of electrode blocks each positioned in one of said pair of open ends and electrically connected to said semiconductor element and cooperative with said hollow cylindrical member to hermetically seal said semiconductor element within the interior of said hollow cylindrical member; wherein at least one of said electrode blocks comprises a one-piece unitary structure having a truncated cone configuration having a smaller diameter end portion in direct contact with said semiconductor element and a larger diameter end portion having a diameter greater than that of said pair of open ends and disposed remote from said semiconductor element, means defining a recess within said larger diameter end portion of said electrode block, and a plurality of projections extending outwardly from the surface of said recess defining with the remainder of said one electrode block a one-piece unitary structure free of metallic interfaces therebetween; a cover member composed of electrically conductive material covering said plurality of projections and directly contacting at least some of said projections to define an electric current path from said cover member through the projections to said semiconductor element and wherein said cover member cooperates with said larger diameter end portion to define a sealed space containing therein said plurality of projections; and means for circulating a cooling medium through said sealed space and around said projections during use of the semiconductor device.

3. A semiconductor device according to claim 2; including a flange connected to a peripheral portion of said smaller diameter end portion; another flange connected to said hollow cylindrical member; and means connecting together said flanges to effect a hermetic seal between said hollow cylindrical member and said at least one electrode block.

4. A semiconductor device according to claim 3; wherein said recess has a conical configuration.

5. A semiconductor device according to claim 3; wherein said plurality of projections have one of at least two different cross-sectional areas, and wherein the projections having the largest cross-sectional area are positioned at the central portion of said recess.

6. A semiconductor device according to claim 1; wherein each of said electrode blocks comprises a one-piece unitary structure having the construction of a truncated cone having a smaller diameter portion and a larger diameter portion, said smaller diameter portion extending into the associated open end portion of said hollow cylindrical member and having its end surface in contact with the adjacent one of said main faces of said semiconductor element and wherein said smaller diameter portion is provided on a peripheral surface portion thereof with a flange welded to a flange disposed on the adjacent open end of said hollow cylindrical member, and wherein said larger diameter portion has an outside diameter greater than that of the open end of said hollow cylindrical member and is positioned outside of said cylindrical member and wherein said larger diameter portion is provided at the free end thereof with means therein defining a recess and a plurality of protrusions extending outwardly from the surface of said recess, defining with the remainder of the associated electrode block a one-piece unitary structure free of metallic interfaces therebetween, and wherein said smaller and larger diameter portions are interconnected by a frusto-conical surface disposed therebetween; and an electrically conductive covering means cooperative with each said larger diameter portion covering said plurality of protrusions to define a sealed space containing therein said plurality of protrusions and wherein each electrically conductive covering means directly contacts at least some of said protrusions on one electrode block to define an electric current path from said covering means through the protrusions to said semiconductor element, and means defining inlet and outlet openings in each covering means for effecting circulation of a cooling medium through said sealed space and around said protrusions during use of the semiconductor device.

7. A semiconductor device according to claim 6; further including fastening means including a pair of pressure plates each coupled to an external surface portion of one of said covering means for applying a fastening force to each covering means urging them and said pair of electrode blocks toward each other to fasten same together.

* * * * *